US011114420B2

(12) United States Patent
Staloff

(10) Patent No.: US 11,114,420 B2
(45) Date of Patent: Sep. 7, 2021

(54) UNIFORMING AN ARRAY OF LEDS HAVING ASYMMETRIC OPTICAL CHARACTERISTICS

(71) Applicant: CORNING INCORPORATED, Corning, NY (US)

(72) Inventor: Daniel Max Staloff, Rochester, NY (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 16/777,295

(22) Filed: Jan. 30, 2020

(65) Prior Publication Data

US 2020/0258868 A1 Aug. 13, 2020

Related U.S. Application Data

(60) Provisional application No. 62/804,276, filed on Feb. 12, 2019.

(51) Int. Cl.
*H01L 25/075* (2006.01)
*F21V 5/00* (2018.01)
(Continued)

(52) U.S. Cl.
CPC .......... *H01L 25/0753* (2013.01); *F21V 5/007* (2013.01); *F21V 5/008* (2013.01); *F21Y 2105/16* (2016.08); *F21Y 2115/10* (2016.08)

(58) Field of Classification Search
CPC ........ H01L 25/753; F21V 5/007; F21V 5/008; F21Y 2105/16
See application file for complete search history.

(56) References Cited

U.S. PATENT DOCUMENTS 8,845,163 B2 9/2014 Stites et al.
2008/0084694 A1* 4/2008 Rose .................. F21V 5/04
362/240

(Continued)

FOREIGN PATENT DOCUMENTS

EP 2640171 A2 9/2013
JP 62002675 A 1/1987

(Continued)

OTHER PUBLICATIONS

Roux, Lighting device for obtaining a uniformly illuminated field, 2011, WO2011032300A1, Espacenet Translation, https://worldwide.espacenet.com/patent/search/family/043304178/publication/WO2011032300A1 (Year: 2011).*

(Continued)

*Primary Examiner* — Rajarshi Chakraborty
*Assistant Examiner* — Michael Chiang
(74) *Attorney, Agent, or Firm* — Amy T. Lang; John P. McGroarty

(57) ABSTRACT

An apparatus comprises an array of light emitting diodes (LEDs), each LED in the array having an asymmetric optical characteristic. The asymmetric optical characteristic of a first subset of LEDs in the array is oriented at an angle of 90°, 180°, or 270° with respect to the asymmetrical optical characteristic of a second subset of LEDs in the array. The apparatus may be the array of LEDs or an illumination system comprising a light source comprising the array of LEDs. Methods of manufacturing the apparatus are also provided.

12 Claims, 3 Drawing Sheets

(51) Int. Cl.
*F21Y 105/16* (2016.01)
*F21Y 115/10* (2016.01)

(56) References Cited

U.S. PATENT DOCUMENTS

| | | | | |
|---|---|---|---|---|
| 2008/0239718 | A1* | 10/2008 | Huttner | F21V 5/007 |
| | | | | 362/231 |
| 2010/0244061 | A1* | 9/2010 | Shirakawa | F21K 9/00 |
| | | | | 257/89 |
| 2012/0092389 | A1* | 4/2012 | Okuyama | H04N 9/30 |
| | | | | 345/690 |
| 2012/0320585 | A1* | 12/2012 | Lin | F21V 5/08 |
| | | | | 362/239 |
| 2013/0201669 | A1* | 8/2013 | Yeh | F21V 3/00 |
| | | | | 362/184 |
| 2015/0179716 | A1* | 6/2015 | Kuroda | F21S 8/04 |
| | | | | 315/86 |
| 2017/0069805 | A1* | 3/2017 | Nagahama | H01L 33/62 |
| 2019/0129011 | A1* | 5/2019 | Ruffo | G01S 7/4815 |
| 2019/0339537 | A1* | 11/2019 | Jiang | G02B 6/0005 |
| 2020/0068103 | A1* | 2/2020 | Huang | G02B 3/00 |

FOREIGN PATENT DOCUMENTS

| | | | | |
|---|---|---|---|---|
| JP | 2002374004 A | 12/2002 | | |
| WO | 2011032300 A1 | 3/2011 | | |
| WO | WO-2011032300 A1 * | 3/2011 | | F21S 8/006 |

OTHER PUBLICATIONS

International Search Report and Written Opinion of the International Searching Authority; PCT/US2020/13689; dated May 11, 2020; 9 Pages; European Patent Office.

* cited by examiner

UNIFORMING AN ARRAY OF LEDS HAVING ASYMMETRIC OPTICAL CHARACTERISTICS

This application claims the benefit of priority to U.S. Provisional Application Ser. No. 62/804,276 filed on Feb. 12, 2019, the content of which is relied upon and incorporated herein by reference in its entirety.

BACKGROUND

Field

The present specification generally relates to illumination systems and, more specifically, to illumination systems including arrays of LEDs having asymmetric optical characteristics.

Technical Background

Microlithography projection systems and other types of projection systems, may require a uniform field of electromagnetic energy from an illumination system to illuminate an object. For example, in microlithography projection systems, the electro-magnetic energy is transferred by an optical system to illuminate a wafer or to create an image in another location. However, if the electro-magnetic energy emitted from the illumination system is not uniform, the projected image will not be uniform.

The use of LED arrays in illumination systems provides a number of advantages over mercury arc lamps in such systems. However, if the LEDs in the array are arranged with the same clocking orientation, a tilt to the irradiance pattern emitted by the illumination system may be present. Since tilt is an "odd function" (e.g., an odd order polynomial), lens arrays that are conventionally used to correct other non-uniformities in the irradiance pattern emitted from LED arrays may not be suitable to correct the tilt in the irradiance pattern due to the uniform clocking orientation of the LEDs, necessitating that additional optical components, such as optical apodizers, be added to the system to correct for the tilt. However, optical apodizers can be expensive and difficult to make and use.

Accordingly, a need exists for alternative methods for uniformizing asymmetric optical characteristics in an LED array of an illumination system.

SUMMARY

According to a first aspect disclosed herein, an apparatus comprises an array of light emitting diodes (LEDs), each LED in the array having an asymmetric optical characteristic, wherein the asymmetric optical characteristic of a first subset of LEDs in the array is oriented at an angle of 90°, 180°, or 270° with respect to the asymmetrical optical characteristic of a second subset of LEDs in the array.

According to a second aspect disclosed herein, the apparatus comprises the apparatus of the previous aspect, wherein the apparatus is the array of LEDs.

According to a third aspect disclosed herein, the apparatus comprises the apparatus of the first aspect, wherein the apparatus is an illumination system, the apparatus comprising: a light source comprising the array of LEDs; an image plane at which (1) an output from the light source is distributed and (2) the asymmetric optical characteristic is uniform; and one or more lenses positioned between the light source and the image plane such that the output from the light source passes through the one or more lenses before being distributed at the image plane.

According to a fourth aspect disclosed herein, the apparatus comprises the apparatus of any of the previous aspects, wherein the first subset of LEDs forms a first row of LEDs, and the second subset of LEDs forms a second row of LEDs.

According to a fifth aspect disclosed herein, the apparatus comprises the apparatus of any of the previous aspects, wherein the asymmetric optical characteristic is an intensity distribution.

According to a sixth aspect disclosed herein, the apparatus comprises the apparatus of any of the previous aspects, wherein the asymmetric optical characteristic is an irradiance distribution.

According to a seventh aspect disclosed herein, the apparatus comprises the apparatus of any of the previous aspects, wherein the asymmetric optical characteristic comprises an intensity distribution and an irradiance distribution.

According to an eighth aspect disclosed herein, the apparatus comprises the apparatus of any of the previous aspects, wherein each LED in the array has a substantially square shape.

According to a ninth aspect disclosed herein, the apparatus comprises the apparatus of any of the previous aspects, wherein the asymmetric optical characteristic of the first subset of LEDs is oriented at an angle of 180° with respect to the asymmetrical optical characteristic of the second sub set of LEDs.

According to a tenth aspect disclosed herein, the apparatus comprises the apparatus of any of the previous aspects, wherein the asymmetric optical characteristic of the first subset of LEDs is oriented at an angle of 90° with respect to the asymmetrical optical characteristic of the second sub set of LEDs.

According to an eleventh aspect disclosed herein, the apparatus comprises the apparatus of any of the previous aspects, wherein the array of LEDs further comprises: a third subset of LEDs oriented at an angle of 180° with respect to the asymmetrical optical characteristic of the second subset of LEDs; and a fourth subset of LEDs oriented at an angle of 180° with respect to the asymmetrical optical characteristic of the second subset of LEDs.

According to a twelfth aspect disclosed herein, a method of manufacturing an LED array comprises affixing a first sub-array of LEDs to a printed circuit board, each LED of the first sub-array of LEDs comprising an asymmetric optical characteristic; and affixing a second sub-array of LEDs to the printed circuit board adjacent to the first sub-array of LEDs, each LED of the second sub-array of LEDs comprising the asymmetric optical characteristic; wherein the asymmetric optical characteristic of each LED of the second sub-array of LEDs is oriented at an angle of 90°, 180°, or 270° with respect to the asymmetric optical characteristic of immediately adjacent LEDs of the first sub-array of LEDs.

According to a thirteenth aspect, the method comprises the method of the twelfth aspect, wherein the asymmetric optical characteristic comprises an intensity distribution or an irradiance distribution.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1:
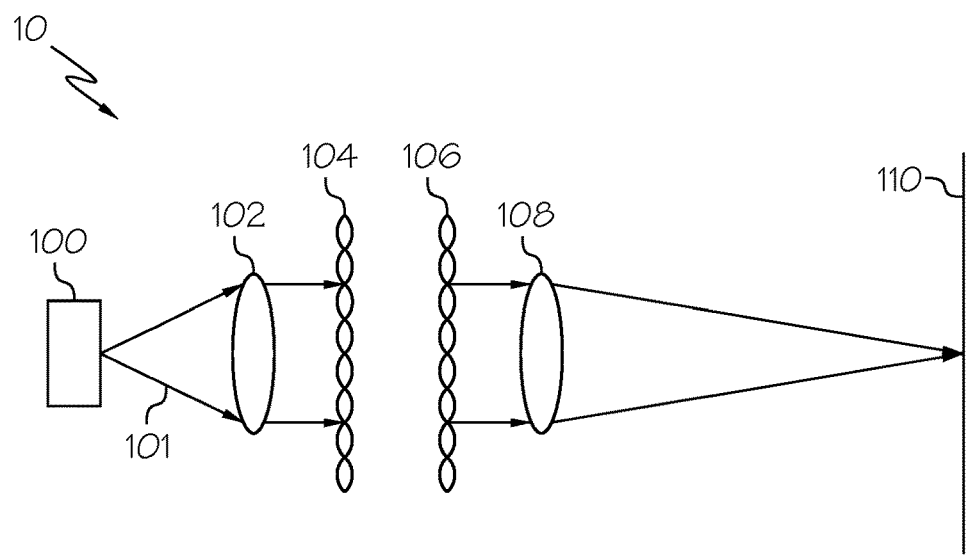
FIG. 1 schematically depicts an illumination system including an LED array according to one or more embodiments shown and described herein.

Reference will now be made in detail to various embodiments, examples of which are illustrated in the accompanying drawings. Whenever possible, the same reference numerals will be used throughout the drawings to refer to the same or like parts. One embodiment of an illumination system including an LED array of the present disclosure is shown in FIG. 1. The LED array is designated generally throughout by the reference numeral 100. The LED array generally includes a plurality of LEDs, each having an asymmetric optical characteristic. As will be described in greater detail below, each of the LEDs in the LED array are specifically oriented to make the asymmetric optical characteristic uniform over the LED array.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

Unless otherwise indicated, all numbers or expressions, such as those expressing dimensions, physical characteristics, and the like, used in the specification (other than the claims) are understood to be modified in all instances by the term "approximately." At the very least, and not as an attempt to limit the application of the doctrine of equivalents to the claims, each numerical parameter recited in the specification or claims which is modified by the term "approximately" should be construed in light of the number of recited significant digits and by applying ordinary rounding techniques.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

The drawings shall be interpreted as illustrating one or more embodiments that are drawn to scale and/or one or more embodiments that are not drawn to scale. This means the drawings can be interpreted, for example, as showing: (a) everything drawn to scale, (b) nothing drawn to scale, or (c) one or more features drawn to scale and one or more features not drawn to scale. Accordingly, the drawings can serve to provide support to recite the sizes, proportions, and/or other dimensions of any of the illustrated features either alone or relative to each other. Furthermore, all such sizes, proportions, and/or other dimensions are to be understood as being variable from 0-100% in either direction and thus provide support for claims that recite such values or any and all ranges or subranges that can be formed by such values.

The terms recited in the claims should be given their ordinary and customary meaning as determined by reference to relevant entries in widely used general dictionaries and/or relevant technical dictionaries, commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used in a manner that is more expansive than its ordinary and customary meaning, the term should be given its ordinary and customary meaning plus the additional expansive meaning, or (b) if a term has been explicitly defined to have a different meaning by reciting the term followed by the phrase "as used in this document shall mean" or similar language (e.g., "this term means," "this term is defined as," "for the purposes of this disclosure this term shall mean," etc.). References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

Referring now to FIG. 1, one example of an illumination system 10 including an LED array 100 is schematically depicted. In the illumination system 10 depicted in FIG. 1, the output flux (indicated by arrows 101) from the LED array 100 is collected by a condenser lens 102, then separated by a first fly's eye lens array 104 before being directed through a second fly's eye lens array 106. The images projected from the first and second fly's eye lens arrays 104, 106 are combined using a combining lens 108 and, thereafter, illuminate an image plane 110. In various embodiments, the first fly's eye lens array 104 is conjugate to the image plane 110, and the second fly's eye lens array 106 is conjugate to the pupil of a projection system including the LED array 100. In embodiments, the first fly's eye lens array 104 is identical to the second fly's eye lens array 106, and may be separated from the second fly's eye lens array 106 by the focal length of the lenslets that make up each fly's eye lens in the array. Accordingly, in various embodiments, the LED array 100 is imaged by the condenser lens 102 and the first fly's eye lens array 104 so that leach lenslet in the second fly's eye lens array 106 has an image of the LED array 100 projected on to its aperture. Additionally, the aperture of each lenslet in the first fly's eye lens array 104 is magnified and imaged on to the image plane 110.

While FIG. 1 schematically depicts one embodiment of an illumination system utilizing an LED array, it should be understood that other configurations of illumination systems utilizing LED arrays are contemplated and possible.

At the image plane 110, the irradiance of the light projected on to the image plane 110 is the summation of the energy passing through all of the lenslets in the first fly's eye lens array 104. However, illumination systems, such as the illumination system depicted in FIG. 1, do not uniformize or correct odd order non-uniformities in the LED array 100. As such, the light projected on to the image plane 110 may be non-uniform in at least one of its properties, such as transmission, irradiance, intensity, and the like. As used herein, the term "uniformize" means that the difference between the minimum and maximum values of the characteristic are minimized. Various embodiments include LEDs that are arranged such that the asymmetric optical characteristic is uniform for the LED array 100, as will be described in greater detail below.

Figure 2:
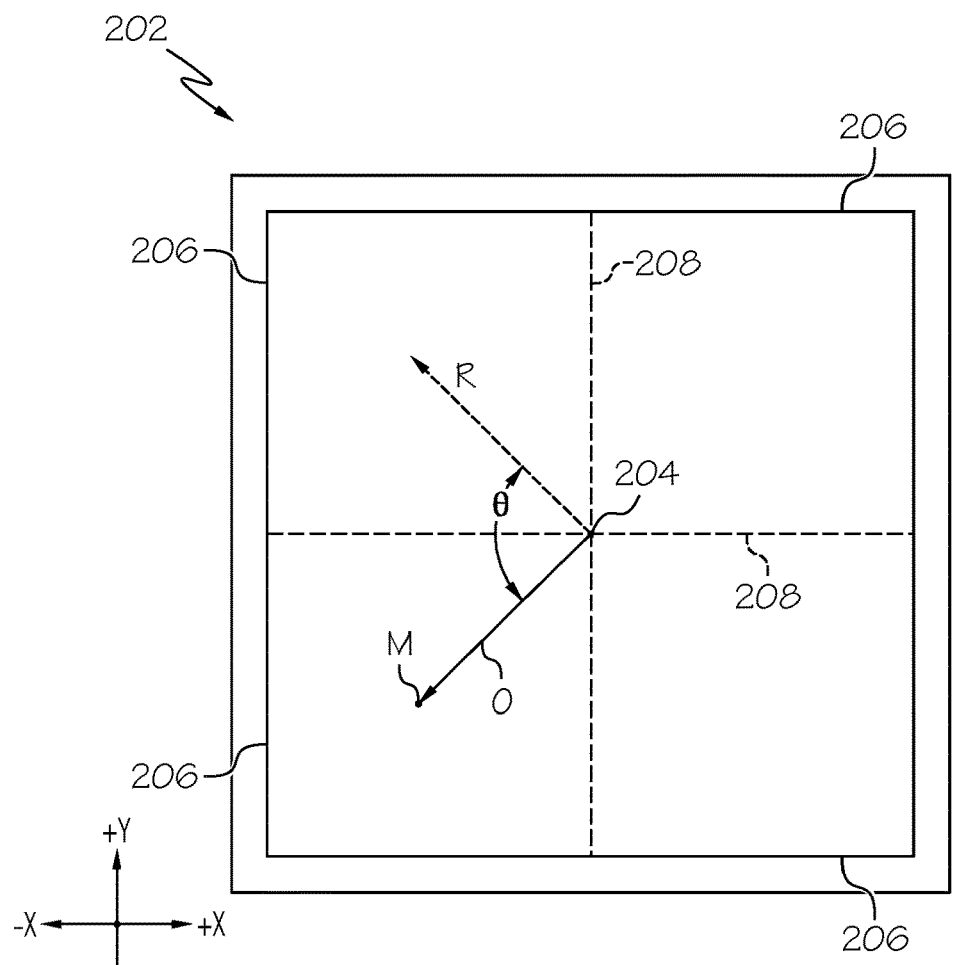
FIG. 2 schematically depicts an example of an LED having an asymmetric optical characteristic according to one or more embodiments shown and described herein.

For example, in various embodiments, each LED 202 (one depicted in FIG. 2) in the LED array 100 (LED arrays depicted in FIGS. 3-5) includes at least one asymmetric optical characteristic that varies over one or more dimensions of the LED (e.g., a length along the Y-axis of FIG. 2 or width along the X-axis of FIG. 2 of the LED). The asymmetric optical characteristic may be, for example, an intensity distribution or an irradiance distribution. The asymmetric optical characteristic may be uniform in one direction, such as along the Y-axis, but non-uniform in another direction, such as along the X-axis, or the asymmetric optical characteristic may be non-uniform in both the X- and Y-directions. However, other asymmetric optical characteristics are possible. In conventional illumination systems in which each LED in the LED array is oriented in the same clocking orientation (e.g., each LED is at an angle of 0° with respect to the other LEDs in the LED array, as will be described in greater detail below), a tilt to the optical characteristic (e.g., the irradiance pattern or intensity) will be present in the light emitted from the illumination systems. Accordingly, in various embodiments, each LED in the LED array may be oriented to correct odd orders of non-uniformity, such as tilt, as will be described in greater detail below. In other words, the arrangement of the LEDs may mitigate the asymmetry of the asymmetric optical characteristic such that the optical characteristic appears or is observed to be uniform for the LED array.

Referring now to FIG. 2, an LED 202 having an asymmetric optical characteristic is schematically depicted. In particular, the LED 202 has an optical characteristic that is asymmetric with respect to a centroid 204 of the LED 202. The centroid 204 of the LED 202 can be calculated by determining a boundary 206 along each side of the LED 202 where the LED 202 outputs a power less than or equal to 10% of the peak power output by the LED 202 and locating the intersection between the medians 208 of each boundary 206. In various embodiments described herein, an optical characteristic of the LED 202 is "asymmetric" when a maximum value of the optical characteristic is measured at a point other than the centroid 204 of the LED. As used herein, the "orientation" of an asymmetric optical characteristic refers to the direction in which a value of a measurement of the optical characteristic increases with respect to the centroid 204. As an example, the maximum value of the optical characteristic of the LED 202 in FIG. 2 is represented by point M and the centroid 204 may be positioned at the origin of the X-Y coordinate axes depicted in FIG. 2. The orientation of the LED 202 is represented by vector O.

The optical characteristic may be measured according to techniques known in the art. For example, the optical characteristic may be measured using a sensor, such as a scanning grating monochromator, a diode array spectrometer, or another sensor suitable for detecting and measuring the LED emission spectrum and, in particular, the optical characteristic. In various embodiments, each LED 202 in the LED array 100 has the same asymmetric optical characteristic (e.g., the same position of the maximum value of the optical characteristic with respect to the centroid of each LED 202).

Figure 3:
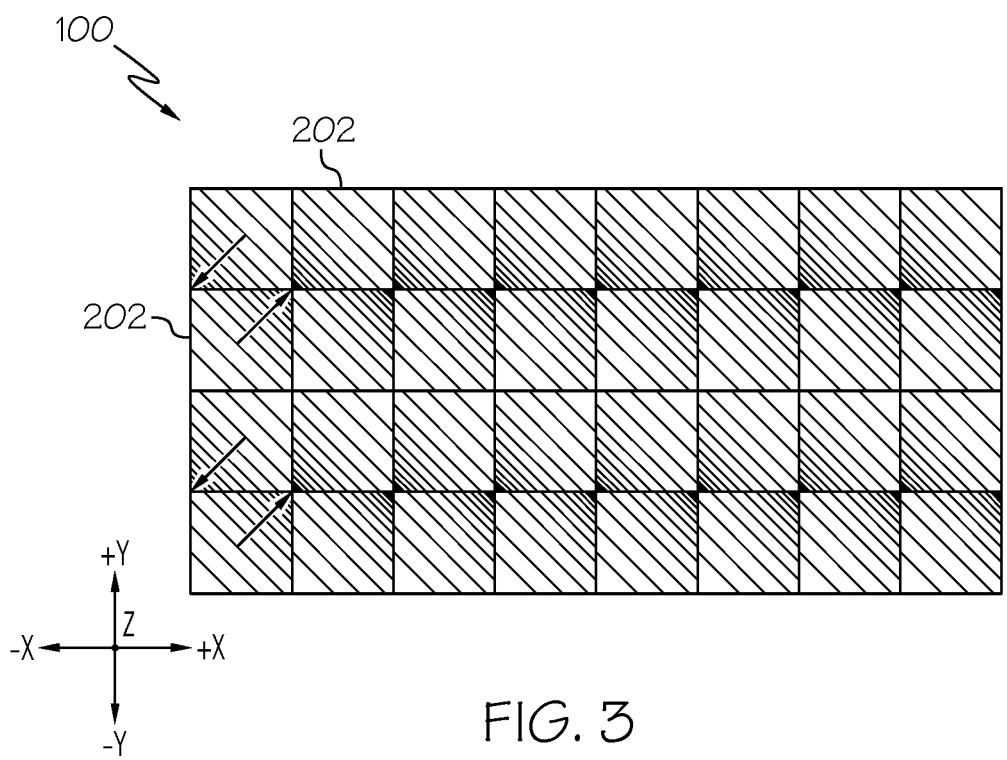
FIG. 3 schematically depicts an example of an LED array according to one or more embodiments shown and described herein.
Figure 4:
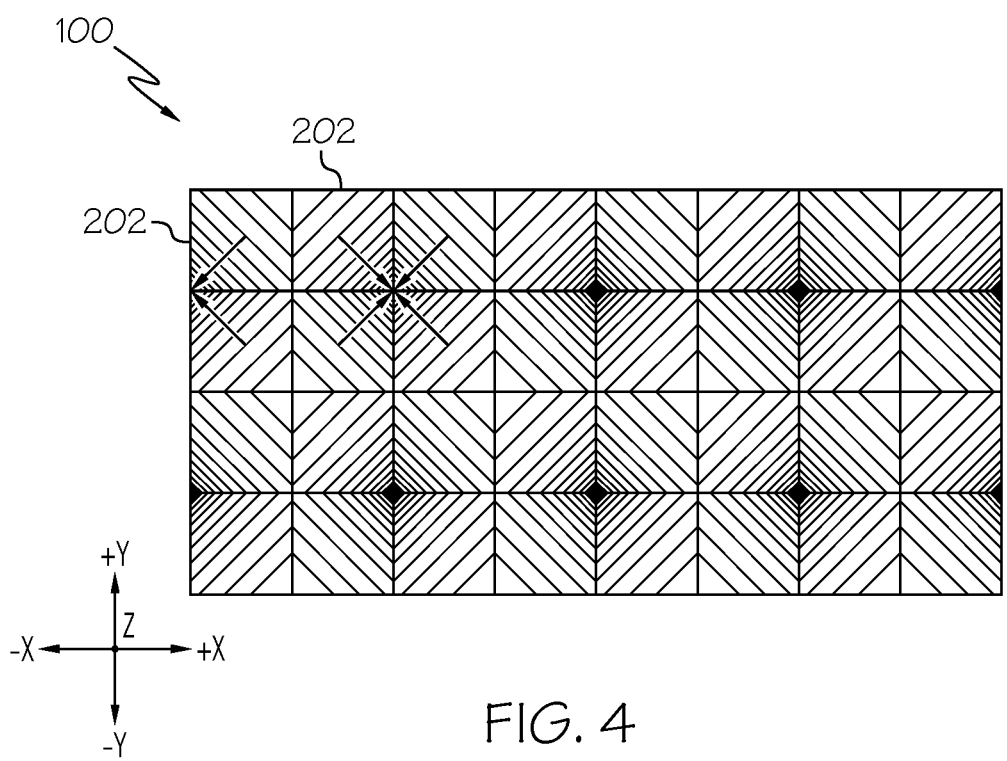
FIG. 4 schematically depicts another example of an LED array according to one or more embodiments shown and described herein.
Figure 5:
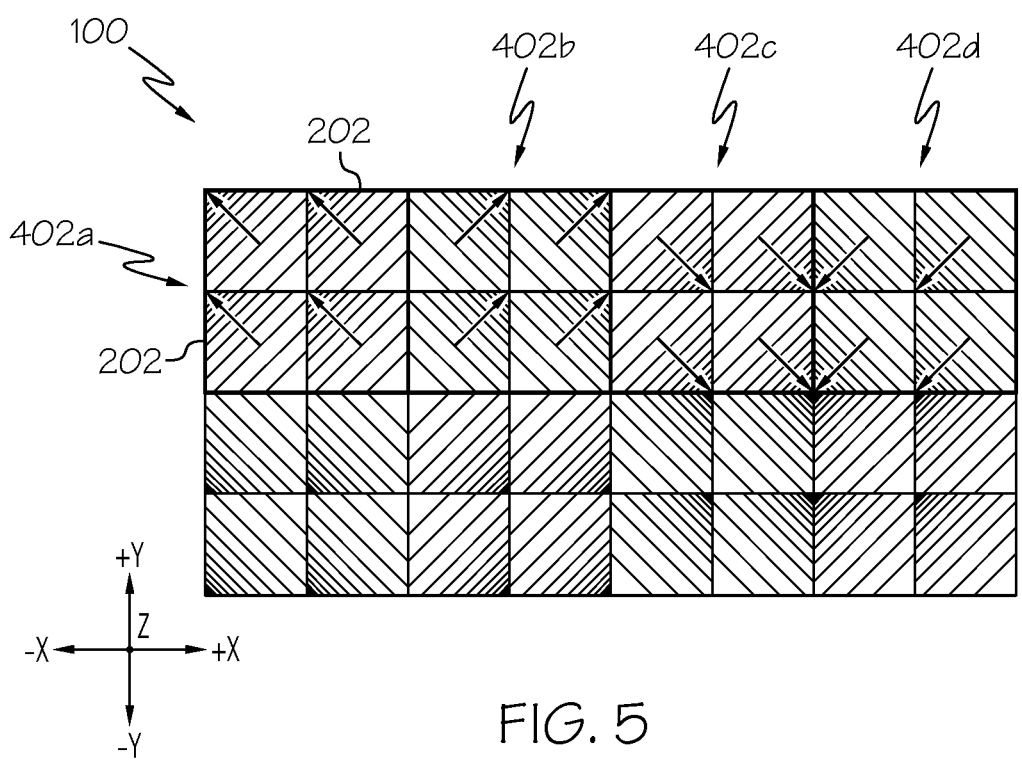
FIG. 5 schematically depicts another example of an LED array according to one or more embodiments shown and described herein.

In various embodiments, the LEDs in the LED array are arranged such that the asymmetric optical characteristic of a first subset of LEDs in the array is oriented at an angle of orientation θ of 90°, 180°, or 270° with respect to the asymmetric optical characteristic of a second subset of LEDs in the array. In such embodiments, the asymmetric optical characteristic appears, or is observed as, symmetrical as output from the array. In various embodiments, the angle of orientation θ is the angle between the asymmetric optical characteristic of the second LED (indicated by vector R superimposed on FIG. 2) with respect to the vector O (of the first LED), as shown in FIG. 2. As used herein, the term "subset" refers to a number greater than 0 and less than all of the LEDs in the array. It is contemplated that the subset of LEDs that are oriented at an angle with respect to the remaining LEDs in the array may be located in various positions within the array and with respect to the remaining LEDs. For example, in some embodiments, the first subset of LEDs may include the LEDs in a first row or column of the array and the second subset of LEDs may include the LEDs in a second row or column of the array that is adjacent to the first row or column, as shown in FIG. 3. Alternatively, in some embodiments, the first subset of LEDs may include every fourth LED, as shown in FIG. 4. In still other embodiments, the first subset of LEDs may include the first two LEDs in each of the first two rows, while a second subset of LEDs may include the third and fourth LEDs in each of the first two rows, or the first and second LEDs in each of the third and fourth rows, as shown in FIG. 5. It should be understood that other embodiments are contemplated and possible. Additionally, it is contemplated that more than two subsets of LEDs may be included in the array. For example, as shown in FIG. 4, a first subset of LEDs may include every fourth LED, starting at the top (+Y) left (−X) corner of the array, a second subset of LEDs may include every fourth LED starting at the second LED in from the top left, a third subset of LEDs may include every fourth LED starting at the third LED in from the top left, and a fourth subset of LEDs may include every fourth LED starting at the fourth LED in from the top left.

In various embodiments, each LED is substantially square in cross-sectional shape. The shape of the LED can be defined, for example, based on a casing or other physical shape associated with the LED, or based on the boundaries 206 (FIG. 2) determined from the power output from the LED. By having a substantially square shape, the LEDs can be oriented at an angle in increments of 90° without altering the overall shape of the LED array 100. In some embodiments, the LEDs may have other shapes, although the acceptable angles of orientation may be affected by the shape. For example, if the LEDs are rectangular in shape, they may be oriented at an angle of 180° relative to another so as to preserve the overall shape of the LED array and maintain the uniformity of other optical characteristics of the array.

FIG. 3 depicts an example embodiment of an LED array 100 in which each row of LEDs 202 (i.e., the LEDs along the −X to +X direction) is oriented at an angle of 180° with respect to an adjacent row. The asymmetric optical characteristic of each LED (e.g., the intensity of the LED) in the first row, or the top row in the +Y direction, increases from top to bottom and from right to left, as indicated by the vectors in FIG. 3. Each LED in the second row, which is adjacent to the first row, has the asymmetric optical characteristic oriented such that it increases from bottom to top and from left to right, as indicated by the vectors. Accordingly, if the vectors from the second row were superimposed on the LEDs of the first row, the angle between the vectors of the first row and the second row would be 180°. The third row from the top has the asymmetric optical characteristic in the same orientation as the first row, and the fourth row from the top has the asymmetric optical characteristic in the same orientation as the second row. Accordingly, the first subset of LEDs includes the LEDs of the first row and/or the third row and the second subset of LEDs can include the LEDs of the second row and/or the fourth row. Although the first row of LEDs is oriented such that the asymmetric optical characteristic is oriented at an angle of 180° with respect to the asymmetric optical characteristic of the second row of LEDs in FIG. 3, it is contemplated that in other embodiments, the first row of LEDs may be oriented such that the asymmetric optical characteristic is oriented at an angle of 90° or even 270° with respect to the asymmetric optical characteristic of the second row of LEDs. However, the 180° variation enables every other row to be oriented at an angle in order to achieve uniformity over the array. In other words, although the orientation of the LEDs does not change the asymmetry of the light emitted from each LED, it changes and corrects the asymmetry of the light emitted from the array.

Turning now to FIG. 4, in other embodiments, each LED 202 in the LED array 100 may be oriented at an angle with respect to adjacent LEDs. The asymmetric optical characteristic of the LED (e.g., the intensity of the LED) in the first row and first column (i.e., the top left corner of the LED array 100 as shown in FIG. 4), increases from top to bottom and from right to left (e.g., in the −Y and −X directions), as indicated by the vectors in FIG. 4. Each adjacent LED has the asymmetric optical characteristic oriented such that if the vectors from the adjacent LEDs were superimposed on the first LED, the angle between the vectors of the first row and the second row would be 90°.

In various embodiments, such as the embodiment shown in FIG. 5, the LEDs 202 in the LED array 100 can be arranged in a plurality of sub-arrays 402, which each contain multiple LEDs 202. In FIG. 5, each sub-array 402 includes four LEDs 202, arranged in a 2×2 configuration. Each LED in each sub-array 402 has the asymmetric optical characteristic oriented in the same direction. That is, the asymmetric optical characteristic of each LED (e.g., the intensity of the LED) in the subarray 402a, increases from bottom to top and from right to left, as indicated by the vectors in FIG. 5, while the asymmetric optical characteristic of each LED (e.g., the intensity of the LED) in the subarray 402b, increases from bottom to top and from left to right, as indicated by the vectors in FIG. 5. Additionally, the asymmetric optical characteristic of each LED (e.g., the intensity of the LED) in the subarray 402c, increases from top to bottom and from left to right, while the asymmetric optical characteristic of each LED (e.g., the intensity of the LED) in the subarray 402d, increases from top to bottom and from right to left. Accordingly, each sub-array may be oriented at an angle with respect to an adjacent sub-array. In other words, if the vectors from the subarray 402b were superimposed on the LEDs of the subarray 402a, the angle between the vectors of the subarray 402a and the subarray 402b would be 90°.

Although the embodiment depicted in FIG. 5 illustrates a sub-array having four LEDs arranged in a 2×2 configuration, other sub-array sizes and configurations are contemplated and possible. Additionally, in various embodiments, orientation may be at an angle of greater than 90°, and may be with respect to sub-arrays that are not adjacent to the reference sub-array. In other words, the particular size and/or shape of the sub-array, or other subset of LEDs in the array of LEDs, is not particularly limited, provided that the LEDs within the LED array are oriented at an angle to enable the minimization of the difference of the optical characteristic over the LED array with respect to a centroid for the LED array.

In various embodiments, the LED array 100 includes a plurality of LEDs affixed to a printed circuit board. The LED array 100 may be manufactured by affixing a first sub-array or other subset of LEDs to the printed circuit board and affix a second sub-array or other subset of LEDs to the printed circuit board. The first and second sub-arrays may be affixed to the printed circuit board simultaneously (e.g., a first LED from the first sub-array, then a first LED from the second sub-array, then a second LED from the first sub-array, then a second LED from the second sub-array, etc.) or may be affixed sequentially (e.g., all of the LEDs from the first sub-array, then all of the LEDs from the second sub-array). The affixing may include, by way of example and not limitation, soldering or otherwise adhering the LEDs to the substrate of the printed circuit board, as is known by those of ordinary skill in the art.

It should now be understood that embodiments of the present disclosure enable solid state light sources, such as LED arrays, to be formed from LEDs having asymmetric optical characteristics without adversely impacting the optical characteristic of the LED array. In particular, various embodiments rotate LEDs in the LED array to uniformize the optical characteristic, enabling correction of odd order non-uniformities in an LED array. Accordingly, such LED arrays may be used in illumination systems without adversely impacting the projection of an image on an image plane.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. An apparatus comprising: an array of light emitting diodes (LEDs), each LED in the array having an asymmetric optical characteristic such that a maximum value of the optical characteristic is at a point other than a centroid of each LED, the array of light emitting diodes comprising a first subset of LEDs, a second subset of LEDs, and a third subset of LEDs,
   the first subset comprising at least a first LED and a second LED such that the first LED is disposed immediately adjacent to the second LED in a first row of LEDs,
   the second subset comprising at least a third LED and a fourth LED such that the third LED is disposed immediately adjacent to the fourth LED in a second row of LEDs,
   the third subset comprising at least a fifth LED and a sixth LED such that the fifth LED is disposed immediately adjacent to the sixth LED in a third row of LEDs,
   the first row being immediately adjacent to the second row and the second row being immediately adjacent to the third row such that the first LED is immediately adjacent to the third LED and the third LED is immediately adjacent to the fifth LED,
   the asymmetric optical characteristic of the fifth LED is oriented in the same direction as the asymmetric optical characteristic of the sixth LED,
   the asymmetric optical characteristics of the first LED, the second LED, the third LED, and the fourth LED are each oriented in the same direction and in a different direction from the asymmetric optical characteristics of the fifth LED and the sixth LED, such that the asymmetric optical characteristics of the first LED, the second LED, the third LED, and the fourth LED are each oriented at an angle of 90°, 180°, or 270° with respect to the asymmetric optical characteristics of the fifth LED and the sixth LED in the array, and
   the first row further comprising a seventh LED that is immediately adjacent to the second LED, the second row further comprising an eighth LED that is immediately adjacent to the fourth LED, and the asymmetric optical characteristics of the seventh LED and the eighth LED are each oriented in the same direction and in a different direction from the asymmetric optical characteristics of the first LED, the second LED, the third LED, and the fourth LED, such that the asymmetric optical characteristics of the seventh LED and the eighth LED are each oriented at an angle of 90°, 180°, or 270° with respect to the asymmetric optical characteristics of the first LED, the second LED, the third LED, and the fourth LED in the array.

2. The apparatus of claim 1, wherein the apparatus is the array of LEDs.

3. The apparatus of claim 1, wherein the asymmetric optical characteristic is an intensity distribution.

4. The apparatus of claim 1, wherein the asymmetric optical characteristic is an irradiance distribution.

5. The apparatus of claim 1, wherein the asymmetric optical characteristic comprises an intensity distribution and an irradiance distribution.

6. The apparatus of claim 1, wherein each LED in the array has a substantially square shape.

7. The apparatus of claim 1, wherein the asymmetric optical characteristic of the first, second, third, and fourth LEDs are oriented at an angle of 180° with respect to the asymmetric optical characteristic of the fifth and sixth LEDs.

8. The apparatus of claim 1, wherein the asymmetric optical characteristic of the first, second, third, and fourth LEDs are oriented at an angle of 90° with respect to the asymmetric optical characteristic of the fifth and sixth LEDs.

9. The apparatus of claim 1, wherein the apparatus is an illumination system, the apparatus comprising:
   a light source comprising the array of LEDs;
   an image plane at which (1) an output from the light source is distributed and (2) the asymmetric optical characteristic is uniform; and
   one or more lenses positioned between the light source and the image plane such that the output from the light source passes through the one or more lenses before being distributed at the image plane.

10. The apparatus of claim 1, wherein the array of LEDs further comprises:
    a fourth subset of LEDs comprising at least a ninth LED and a tenth LED, the asymmetric optical characteristics of the ninth LED and the tenth LED being oriented in the same direction as the asymmetric optical characteristics of the fifth LED and the sixth LED.

11. A method of manufacturing an array of light emitting diodes (LEDs), the method comprising:
    affixing a first sub-array of LEDs to a printed circuit board, the first sub-array comprising at least a first LED and a second LED such that, when affixed to the printed circuit board, the first LED is disposed immediately adjacent to the second LED in a first row of LEDs;
    affixing a second sub-array of LEDs to the printed circuit board, the second sub-array comprising at least a third LED and a fourth LED such that, when affixed to the printed circuit board, the third LED is disposed immediately adjacent to the fourth LED in a second row of LEDs; and
    affixing a third sub-array of LEDs to a printed circuit board, the third sub-array comprising at least a fifth LED and a sixth LED such that, when affixed to the printed circuit board, the fifth LED is disposed immediately adjacent to the sixth LED in a third row of LEDs,
    wherein, when affixed to the printed circuit board:
       the first row is immediately adjacent to the second row and the second row is immediately adjacent to the third row such that the first LED is immediately adjacent to the third LED and the third LED is immediately adjacent to the fifth LED,
       an asymmetric optical characteristic of the fifth LED is oriented in the same direction as an asymmetric optical characteristic of the sixth LED, the asymmetric optical characteristic being that a maximum value of the optical characteristic is at a point other than a centroid of the LED,
       asymmetric optical characteristics of the first LED, the second LED, the third LED, and the fourth LED are each oriented in the same direction and in a different direction from the asymmetric optical characteristics of the fifth LED and the sixth LED, such that the asymmetric optical characteristics of the first LED, the second LED, the third LED, and the fourth LED are each oriented at an angle of 90°, 180°, or 270° with respect to the asymmetric optical characteristics of the fifth LED and the sixth LED, and a seventh LED of the first row is immediately adjacent to the second LED, an eighth LED of the second row is immediately adjacent to the fourth LED, and asymmetric optical characteristics of the seventh LED and the eighth LED are each oriented in the same direction and in a different direction from the asymmetric optical characteristics of the first LED, the second LED, the third LED, and the fourth LED, such that the asymmetric optical characteristics of the seventh LED and the eighth LED are each oriented at an angle of 90°, 180°, or 270° with respect to the asymmetric optical characteristics of the first LED, the second LED, the third LED, and the fourth LED.

12. The method of claim 11, wherein the asymmetric optical characteristic comprises an intensity distribution or an irradiance distribution.

* * * * *